United States Patent [19]

Furukawa et al.

[11] 4,177,379
[45] Dec. 4, 1979

[54] BACK-SCATTERED ELECTRON DETECTOR FOR USE IN AN ELECTRON MICROSCOPE OR ELECTRON BEAM EXPOSURE SYSTEM TO DETECT BACK-SCATTERED ELECTRONS

[75] Inventors: Yasuo Furukawa, Tokyo; Yoshiro Goto, Yokohama; Takefumi Inagaki, Kawasaki, all of Japan

[73] Assignee: Fujitsu Limited, Japan

[21] Appl. No.: 942,455

[22] Filed: Sep. 14, 1978

[30] Foreign Application Priority Data

Sep. 14, 1977 [JP] Japan .......................... 52-124112[U]

[51] Int. Cl.² ............................................ G01N 23/00
[52] U.S. Cl. .................................... 250/306; 250/310; 250/397
[58] Field of Search ............... 250/306, 308, 310, 311, 250/396 R, 397, 492 A, 368; 313/371, 372

[56] References Cited

U.S. PATENT DOCUMENTS

| | | | |
|---|---|---|---|
| 2,841,715 | 7/1958 | Schultz | 250/368 |
| 3,047,719 | 7/1962 | Mayer | 250/306 |
| 3,141,105 | 7/1964 | Courtney-Pratt | 250/306 |
| 3,426,174 | 2/1969 | Graham et al. | 250/306 |
| 3,539,808 | 11/1970 | Hahn | 250/308 |

*Primary Examiner*—Bruce C. Anderson
*Attorney, Agent, or Firm*—Staas & Halsey

[57] ABSTRACT

A back-scattered electron detector for use in an electron microscope of an electron beam exposure system for detecting back-scattered electrons from a specimen includes a transparent plate employed as a light transmitting guide, and a part of the plate having a plastic scintillator coated thereon which emits light outputs in accordance with the back-scattered electrons. Gratings are provided at the scintillator part of the plate to reflect the emitted light outputs so as to be transmitted to a photo-electric convertor at the end of the plate. An aluminum layer is coated on the outside surface of the transparent plate for increasing light reflecting efficiency thereof.

12 Claims, 7 Drawing Figures

Ver. 500 mV/div.
Hor. 5 um/div.

BACK-SCATTERED ELECTRON DETECTOR FOR USE IN AN ELECTRON MICROSCOPE OR ELECTRON BEAM EXPOSURE SYSTEM TO DETECT BACK-SCATTERED ELECTRONS

BACKGROUND OF THE INVENTION

1. Field of the Invention

This invention relates to an improvement of a back-scattered electron detector for detecting back-scattered electrons, employed in an electron microscope or an electron beam exposure system which is used in manufacturing semiconductor devices such as large-scale integrated circuit devices.

2. Description of the Prior Art

For a back-scattered electron detector, several ideas have been proposed and tried, one of which is a semiconductor type detector having a PN junction from which electric signals may be generated in accordance with the amount of back-scattered electrons colliding with the PN junction. Such a type detection has been disclosed in the paper titled "Computer Controlled Electron Microfabrication Machine With A New Registration System" of Journal of Physics E: Scientific Instruments 1974, Volume 7 (1974), and also is available as a semiconductor type detector, "Si Surface Barrier Detector", a product of Oltec Company, U.S.A.

Another type of a back-scattered electron detector has been proposed by the inventors of the present invention. The porposed detector comprises phosphor which emits light outputs by being excited by electrons, a light guide and a photo-multiplier, and as a light guide a glass prism is used to guide the emitted light outputs to the photo-multiplier.

Meanwhile, in view of the function of an electron microscope or an electron beam exposure system, high speed detecting of electrons is required in a back-scattered electron detector. For this requirement, a semiconductor type detector such as explained above is not adequate. The detecting speed of the semiconductor type detector is not satisfactorily high enough as required, due to the delay based on the inherent capacitance of the device, itself, while the detector proposed by the inventors of the present invention has been improved in high-speed detection of electron beams.

In an electron microscope or an electron beam exposure system, focusing lenses and deflection coils are provided respectively to focus and to deflect electron beams. A final focusing lens is important as it is used for finally focusing electron beams on the surface of a specimen to be observed in an electron microscope or to be exposed with electrons in an electron beam exposure system.

There are two types of arrangements of a deflection coil and the final focusing lens, one of which being that the deflection coil is before or in the final focusing lens so that an ample space between the final lens and the specimen is available, which space is used for a back-scattered electron detector. The other type of arrangement is called a post-lens deflection type, and of some advantage in designing the focusing and deflection of electron beams, compared with the former type. In the post-lens deflection type, the deflection coil is after the final focusing lens, that is, between the final focusing lens and the specimen. Therefore, as can be easily understood, the post-lens type has difficulty in receiving a back-scattered electron detector between the deflection coil and the specimen as the space therebetween is scanty. In this regard, the above mentioned detector proposed by the inventors of the present invention also is not suitable for use in the post-lens deflection type because the thickness of a glass prism is comparatively too large for the space between the deflection coil and the specimen.

SUMMARY OF THE INVENTION

Accordingly, it is an object of the present invention to provide a back-scattered electron detector which has eliminated the above-mentioned difficulty.

Another object of the present invention is to provide a back-scattered electron detector for performing high-speed detection of electrons and having an improved structure applicable to the post-lens deflection type of arrangement.

An additional object of the invention is to provide a back-scattered electron detector having a configuration combining a plastic scintillator, an improved light guide and a light to electric signal convertor.

Further features and advantages of the invention will be apparent from the ensuing description with reference to the accompanying drawings to which, however, the scope of the invention is in no way limited.

DESCRIPTION OF THE PREFERRED EMBODIMENT

Figure 1A:
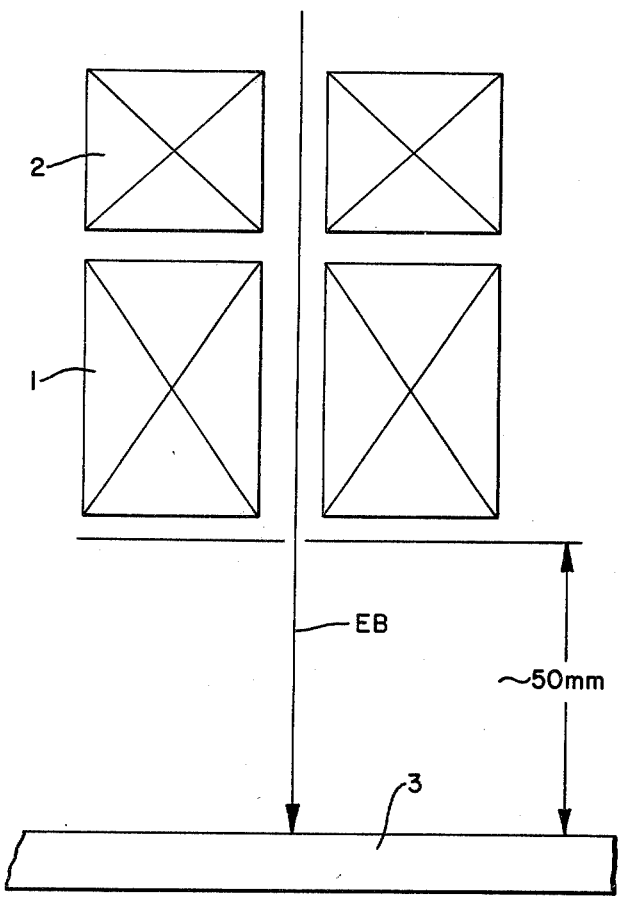
FIG. 1(A) and 1(B) show two types of arrangements of a deflection coil and a final focusing lens, which are provided in an electron microscope or an electron beam exposure system.
Figure 1B:
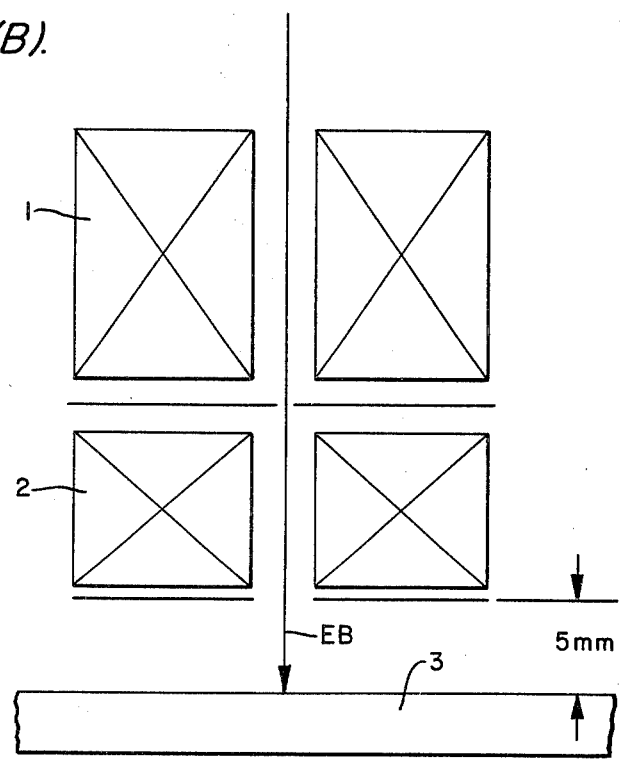

FIGS. 1(A) and 1(B) show the arrangements of a deflection coil 2 and a final focusing lens 1 employed in an electron microscope or an electron beam exposure system. In FIG. 1(A), the deflection coil 2 is positioned before the final focusing lens 1. The arrangement of FIG. 1(A), which is hereinafter called a pre-lens deflection may provide a working distance of about 50 mm between the final focusing lens 1 and a specimen 3 to be observed in an electron microscope or to be exposed with electrons in an electron beam exposure system. The specimen 3, for example, may be a semiconductor wafer, which is used in manufacturing a semiconductor circuit device, such as a Large-Scale integrated circuit. An electron beam EB is focused and positioned on the surface of the specimen through the deflection coil and final focusing lens as shown in FIG. 1(A), and the accuracy of positioning the electron beam EB at a predetermined position on the surface is determined by the control of the deflection coil and final focusing lens.

In FIG. 1(A), as there is provided a final focusing lens 1 after a deflection coil 2, an off-axial electron beam must be taken account of in designing of the final focusing lens 1 so as to have an electron beam accurately focused at a predetermined position of the specimen.

In the arrangement of FIG. 1(B), which hereinafter is called a post-lens deflection, a deflection coil 2 is positioned after a final focusing lens 1, that is, between the final focusing lens 1 and a specimen 3. In this case, the design of the final focusing lens 1 is easy, compared with the pre-lens deflection of FIG. 1(A), because it is not necessary to take account of an off-axial electron beam, but the space between the deflection coil 2 and the specimen 3 is scanty, and not ample enough, compared with the pre-lens deflection. The working distance is about 5 mm between the deflection coil 2 and a specimen 3.

Figure 2:
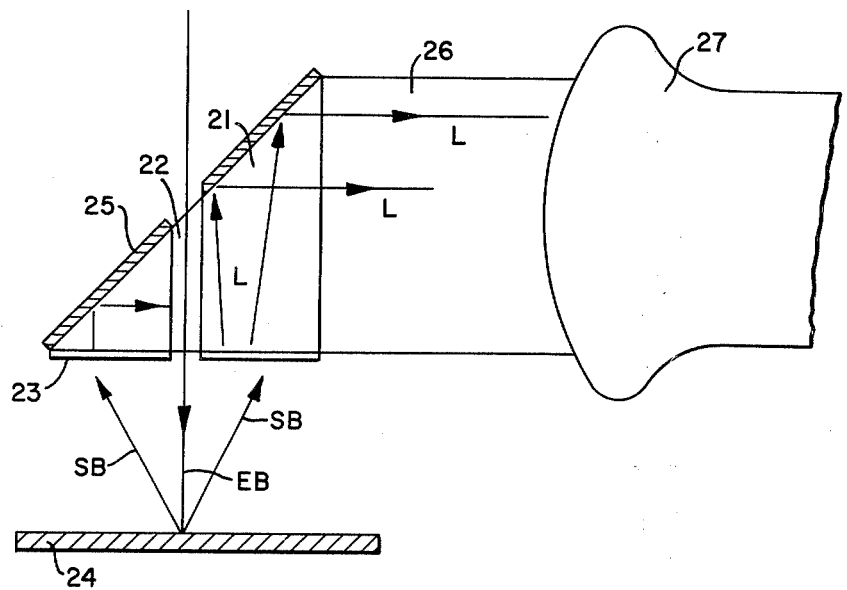
FIG. 2 is a partial cross-section of a back-scattered electron detector proposed by the inventors prior to the present invention.

Now referring to FIG. 2, a partial cross-sectional view of a back-scattered electron detector is shown which has been proposed by the inventors of the present invention. This detector is characterized by high-speed detecting of electrons, compared with a semiconductor type detector of the prior art as explained above.

In FIG. 2, numeral 21 designates a right-angle prism, and numeral 22 is a hole provided at the center of the prism to allow a primary electron beam to pass therethrough. At the bottom of the prism 21, a scintillator 23 is provided, which converts back-scattered electrons SB reflected from a specimen 24 to light outputs L. The scintillator 23 may be the same as that explained later as included with the present invention.

The light outputs L emitted by the scintillator 23 pass to the slanting surface of the prism 21 and at the surface thereof are reflected into guide 26. On the slanting surface of the prism 21, an aluminum coating 25 is provided to make possible the more efficient reflection of the light output L. The light guide 26 comprises, for example, optical glass fibers. The light outputs L transmitted through the light guide 26 are inputed into a photo-electric convertor 27, and for this photo-electric convertor, a photo-multiplier may be used as well as a convertor of the semiconductor type. Thus, electric signals corresponding to the amount of back-scattered electrons reflected by the specimen are outputed from the photo-electric convertor 27.

Such a back-scattered electron detector, as explained with reference to FIG. 2, is usually placed at the position where it can detect back-scattered electrons, that is, in the working distance between the specimen 3 and the final focusing lens or the deflection coil respectively as shown in FIGS. 1(A) and 1(B). However, the placing of the detector, such as shown in FIG. 2, is restricted because the thickness of the prism 21 is considerable, and thus it is difficult to place the detector of FIG. 2 in the working distance between the deflection coil 2 and the specimen 3 in the case of the post-lens deflection, such as shown in FIG. 1(B).

The back-scattered electron detector of the present invention is much improved in the sense of placing thereof, and now is described in detail.

Figure 3:
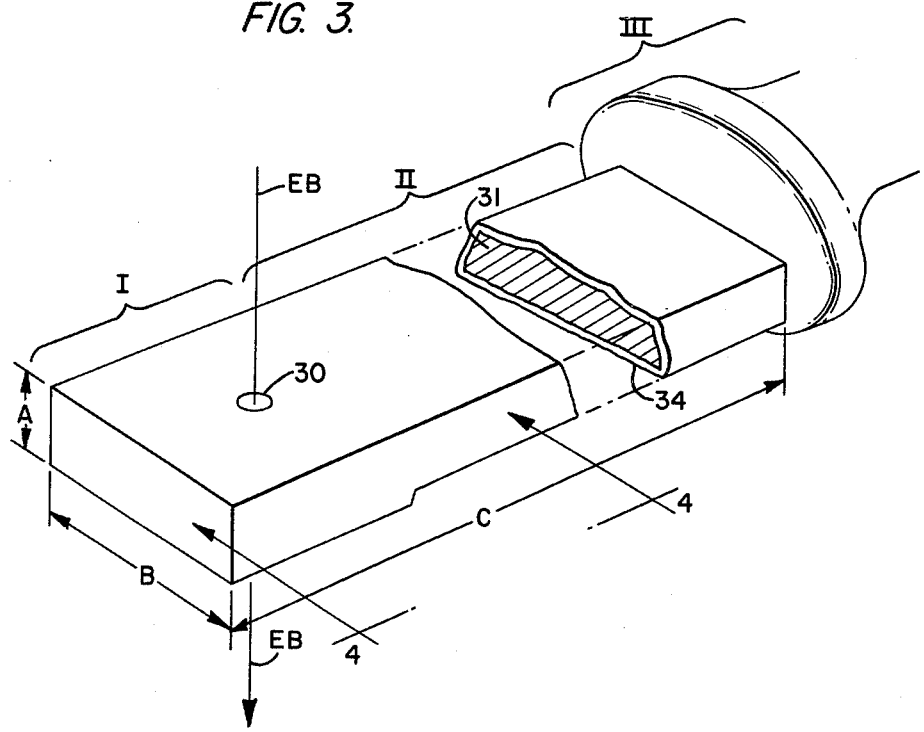
FIG. 3 is a perspective view of a back-scattered electron detector in accordance with one embodiment of the present invention.
Figure 4:
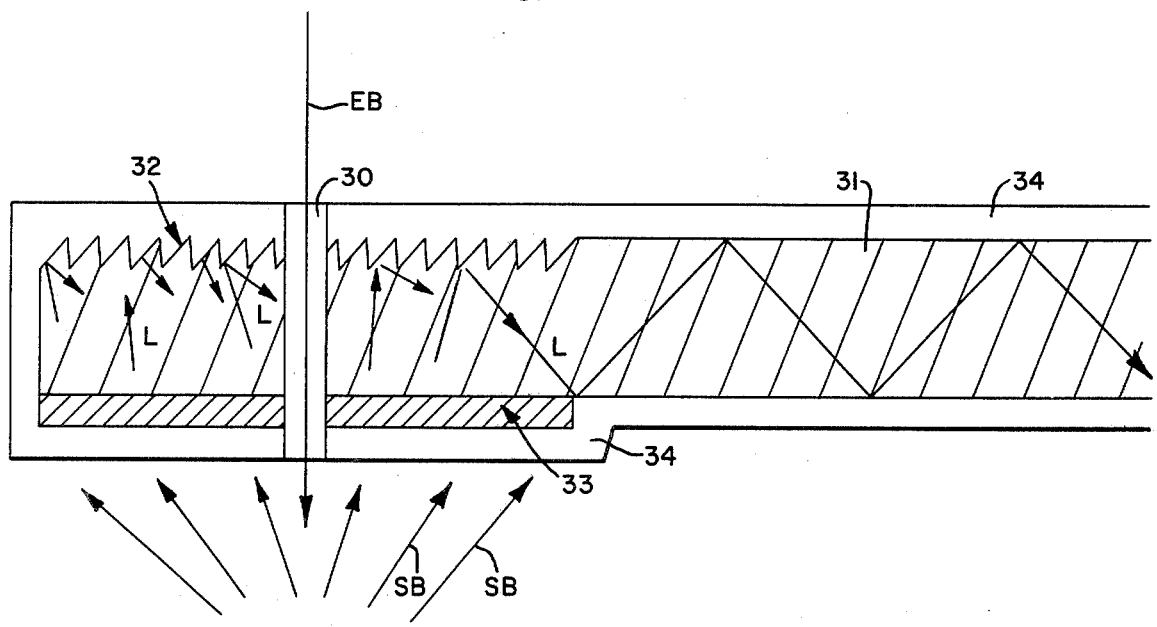
FIG. 4 is a partial cross-section of the detector shown in FIG. 3.

FIG. 3 is a perspective view, a part thereof being omitted for easier understanding, of a back-scattered electron detector in accordance with one embodiment of the invention. FIG. 4 shows a cross sectional view of the detector of FIG. 3, observed in the direction of the lines 4—4 in FIG. 3. The detector of FIG. 3 comprises a scintillator part I which converts back-scattered electrons to light outputs, a light transmitting part II whereby the light outputs are transmitted, and a light to electric signal convertor part III. Reference characters A, B, and C in FIG. 3 respectively designate the height, the width and the length of the scintillator part I and light transmitting part II, and in accordance with an example of the invention, A is about 3 mm, B is about 20 mm and C is about 200 mm. In FIGS. 3 and 4, the dimensions A, B and C are not shown with their actual relationship in order to make it easy to understand the structure of the scintillator part I and light transmitting part II.

In the scintillator part I, there is provided a hole 30 through which an electron beam passes to a specimen to be observed in an electron microscope or to be exposed with the electron beam in an electron beam exposure system. The diameter of the hole 30 is about 3 mm. The scintillator part I and light transmitting part II comprise a transparent thin plate 31, made of glass or plastic, and the top surface of the plate 31 in the scintillator part I is provided with gratings 32. The gratings 32 may be of any shape (sawtooth ridges shown) which can scatter and transmit emitted light outputs to the transmitting part II and may be formed by a mold simultaneously with the forming of the transparent plate 31.

Reference numeral 33 indicates a scintillator which emits light outputs L by back-scattered electrons SB as already explained with reference to FIG. 2. The scintillator 33 is formed on the transparent plate 31 by dissolving plastic scintillator NE-110, which is a product of Nuclear Enterprise Company of England, with xylene and then coating the dissolved plastic scintillator onto the plate 31, and then drying it.

The amount of emitted light outputs from the scintillator 33 is determined by the number and energy of electrons entering into the scintillator 33. In the case where the number of entering electrons is small, the amount of emitted light outputs is relative to the energy of the entering electrons. Therefore, the thickness of the scintillator is desired to be more than the depth which back-scattered electrons may penetrate so that the electrons may efficiently contribute to emitting light outputs L. As for the plastic scintillator, especially in the case of NE 110, the loss of light transparency to the wave length of emitted light outputs is as much as 0.004/cm. This figure of loss is considered acceptable and the thickness of the scintillator is relatively unimportant just as long as it is more than the penetrating depth of the back-scattered electrons into the scintillator.

The scintillator part I and transmitting part II are coated with an aluminum layer 34, which may be formed by a technique such as vacuum vapour depositioning of aluminum, and the aluminum coating layer 34 hereinafter is referred to as metal-backing.

The beneficial effect of the metal-backing is that the light outputs emitted by the scintillator 33 may be effectively reflected back into the plate by the mirror function of the metal-backing so that most of the light outputs may be transmitted to the photo-electric convertor III, by being repeatedly reflected as shown in FIG. 4.

It is further beneficial effect of the metal-backing that deceleration of back-scattered electrons due to charged-up electrons on the surface of the scintillator can be prevented by using the metal backing, and thus the light emitting efficiency of the scintillator 33 increases. As back-scattered electrons come in the scintillator 33 through the metal-backing, it is preferable to minimize the energy loss of the back-scattered electrons by the metal-backing. Aluminum is preferable as the metal-backing material since the energy loss thereof is small and the coefficient of light reflection thereof is superior. The thickness of the metal-backing 34 in the embodiment of FIGS. 3 and 4 is about 1500 Å.

The photo-electric convertor used may be of any kind, such as a semiconductor type or a photomultiplier type.

Figure 5:
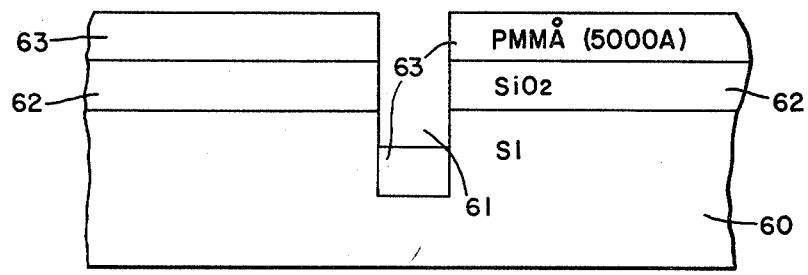
FIG. 5 depicts a model of a mark provided on a semiconductor substrate for detecting a position of electron beams.

Referring to FIG. 5 an example will be explained of how to use the detector of the invention. Shown is a partial cross-sectional view of a specimen, at one stage of manufacturing a semiconductor circuit device by an electron beam exposure system, which comprises a semiconductor substrate 60 of for example, silicon. Masking is absolutely necessary in manufacturing a semiconductor circuit device and an electron beam exposure system may be used for forming a mask pattern using an electron beam resist. In FIG. 5, numeral 61 is a groove provided in the substrate 60 and used to determine a standard position when making a mask on the substrate. The groove 61 is formed by etching after the oxidization of the surface of the substrate 60, after which the surface is provided with $SiO_2$ layer 62, and then an electron beam resist layer 63 is formed on the $SiO_2$ layer 62.

Now considering that a pattern is exposed on the resist layer 63, it is required first to overlap the position of the groove 61 on a predetermined position of an exposing field, and thus the exposing field is shifted so as to make the distance between the predetermined position and the position of the groove 61 to be zero, by detecting back-scattered electrons to find out the groove 61.

Figure 6:
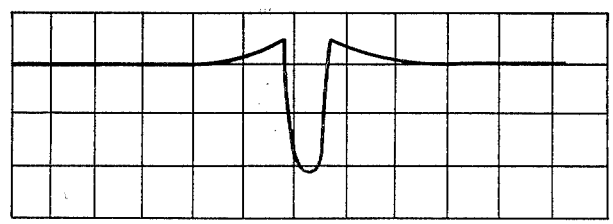
FIG. 6 shows a waveform of an output signal from the detector shown in FIG. 3 when detecting the mark of FIG. 5.

FIG. 6 shows an output signal of a back-scattered electron detector in accordance with the invention when the primary electron beam EB is scanned on the groove 61 of FIG. 5. As described, the detection of the position of the groove 61 is performed by observing the change of the output signal as shown in FIG. 6.

We claim:

1. A back-scattered electron detector for use in an electron microscope or electron beam exposure system comprising:
   a transparent plate having;
   a scintillator part for emitting light outputs in accordance with electrons back-scattered from a specimen to be observed in an electron microscope or to be exposed with electrons in an electron beam exposure system, said scintillator part being provided with a hole through which a primary electron beam passes to the specimen and with gratings by which the emitted light outputs are reflected; and
   a transmitting part for transmitting the emitted, scattered light outputs from the scintillator part;
   metal-backing means on the surface of said transparent plate for increasing light reflecting efficiency thereof; and
   convertor means connected to said transparent plate for converting the transmitted light outputs into corresponding electric signals.

2. A detector as in claim 1, wherein said transparent plate includes a plastic scintillator coated thereon at the scintillator part for emitting the light outputs.

3. A detector as in claim 1, wherein said metal-backing means on the surface of said transparent plate for increasing light efficiency thereof includes a layer of aluminum on the outer surface of said transparent plate.

4. A detector as in claim 3, wherein the layer of aluminum on the outer surface of said transparent plate is of a thickness of about 1500 Å.

5. A detector as in claim 1, wherein said convertor means connected to said transparent plate for converting the transmitted light outputs into corresponding electric signals includes a photo-electric convertor.

6. A detector as in claim 1, wherein said gratings on the scintillator part of the transparent plate have a sawtooth configuration for maximum efficiency of light reflection with minimum height.

7. An electron detector for use with apparatus having structure for producing an electron beam, structure for deflecting and focusing of the electron beam onto a specimen with resulting back-scattered electrons being emitted, and with a minimum of space between said specimen and the deflecting and focusing structure, comprising:
   an elongated transparent plate of minimal thickness for fitting in said minimum of space, the plate having at one end a scintillator part provided with a hole through which the electron beam passes to the specimen and the rest of the plate functioning as a transmitting part for transmitting the emitted scattered light outputs from the scintillator part; and
   a photo-electric convertor associated with the other end of said transparent plate.

8. A structure as set forth in claim 7, wherein said elongated transparent plate is approximately 200 mm long, approximately 20 mm wide, and approximately 3 mm thick.

9. A structure as set forth in claim 7, together with metal-backing means on the outer surface of said transparent plate for increasing light reflecting efficiency thereof.

10. A structure as set forth in claim 9, wherein said metal-backing means includes a layer of aluminum of approximately 1500 Å in thickness.

11. A structure as set forth in claim 7, wherein said scintillator part includes a layer of plastic scintillator material on the one end of the elongated transparent plate and grating means provided in the plate opposite said layer of scintillator material for maximum efficiency of light reflection with minimum height.

12. A structure as set forth in claim 11, wherein said grating means includes a plurality of sawtooth ridges formed in the one end of the transparent plate opposite the layer of plastic scintillator material.

* * * * *

UNITED STATES PATENT AND TRADEMARK OFFICE
CERTIFICATE OF CORRECTION

PATENT NO. : 4,177,379

DATED : December 4, 1979

INVENTOR(S) : YASUO FURUKAWA ET AL.

It is certified that error appears in the above-identified patent and that said Letters Patent are hereby corrected as shown below:

Col. 1, line 30, "porposed" should be --proposed--;

Col. 2, line 20, "scintilator" should be --scintillator--;

Col. 3, line 39, "inputed" should be --inputted--;

Col. 3, line 44, "outputed" should be --outputted--.

Signed and Sealed this

Fifteenth Day of April 1980

[SEAL]

Attest:

SIDNEY A. DIAMOND

Attesting Officer

Commissioner of Patents and Trademarks